(12) United States Patent
Shin et al.

(10) Patent No.: US 7,915,070 B2
(45) Date of Patent: Mar. 29, 2011

(54) METHOD FOR FABRICATING ORGANIC LIGHT EMITTING DISPLAY DEVICE

(75) Inventors: Hey-Jin Shin, Suwon-si (KR); Won-Kyu Kwak, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 185 days.

(21) Appl. No.: 12/436,026

(22) Filed: May 5, 2009

(65) Prior Publication Data
US 2009/0311824 A1    Dec. 17, 2009

(30) Foreign Application Priority Data
Jun. 11, 2008   (KR) ................. 10-2008-0054545

(51) Int. Cl.
*H01L 21/00*   (2006.01)
*G02F 1/1333*   (2006.01)
(52) U.S. Cl. .............. 438/80; 257/E21.499; 349/40
(58) Field of Classification Search .......... 438/80; 257/E21.499; 349/40
See application file for complete search history.

(56) References Cited

U.S. PATENT DOCUMENTS

| | | | | |
|---|---|---|---|---|
| 5,805,246 A | * | 9/1998 | Lee et al. | 349/40 |
| 7,081,770 B2 | * | 7/2006 | Lee et al. | 324/760.01 |
| 2004/0124869 A1 | * | 7/2004 | Lee et al. | 324/770 |
| 2006/0017373 A1 | * | 1/2006 | Lee, II | 313/500 |
| 2008/0068309 A1 | * | 3/2008 | Kwak et al. | 345/82 |
| 2009/0278835 A1 | * | 11/2009 | Ka | 345/211 |

FOREIGN PATENT DOCUMENTS

| | | |
|---|---|---|
| JP | 2004-47222 | 2/2004 |
| KR | 10-0251090 B1 | 1/2000 |
| KR | 10-0495799 B1 | 6/2005 |
| KR | 10-2005-0087211 | 8/2005 |
| KR | 10-2007-0068031 | 6/2007 |

OTHER PUBLICATIONS

KIPO Office action dated Feb. 25, 2010, for priority Korean Patent application 10-2008-0054545, noting listed references in this IDS.

* cited by examiner

*Primary Examiner* — Lex Malsawma
(74) *Attorney, Agent, or Firm* — Christie, Parker & Hale, LLP

(57) ABSTRACT

A fabricating method of an organic light emitting display device including performing a sheet test as a sheet unit on a mother board formed with panels and sheet wires for supplying test signals to the panels on the mother board, the method including: forming drive elements for driving the panels in each of the panels and forming sheet wires electrically coupled to at least a portion of the drive elements and shorting bar electrically coupling all of the sheet wires; forming organic light emitting diodes in each of the panels and isolating the sheet wires from each other by etching open regions of the shorting bar apart from contact regions of the shorting bar for coupling the shorting bar to the sheet wires; performing the sheet test on the plurality of panels by supplying the test signals to the sheet wires; and separating the panels by scribing the mother board.

19 Claims, 6 Drawing Sheets

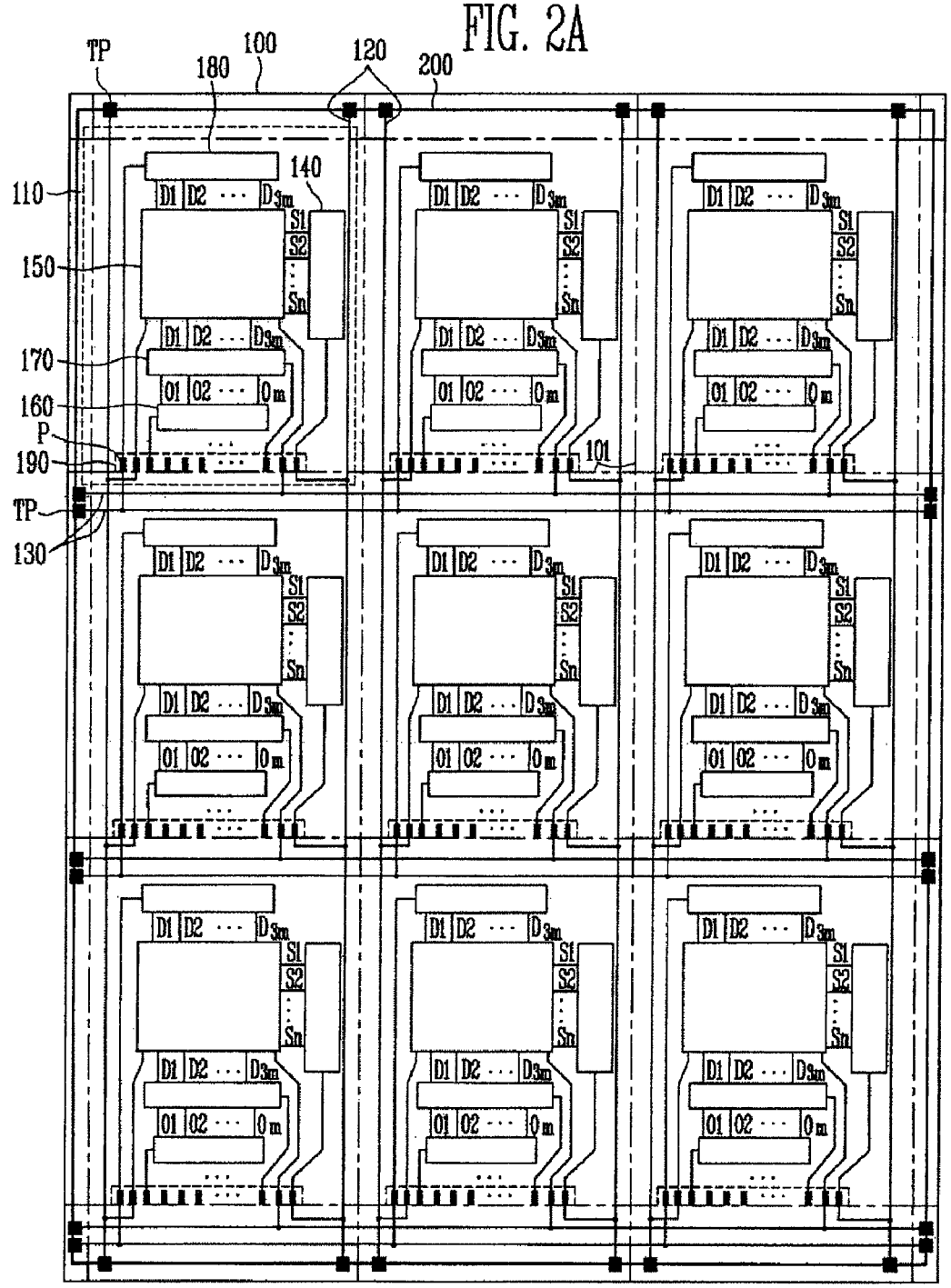

METHOD FOR FABRICATING ORGANIC LIGHT EMITTING DISPLAY DEVICE

CROSS-REFERENCE TO RELATED APPLICATION

This application claims priority to and the benefit of Korean Patent Application No. 10-2008-0054545, filed on Jun. 11, 2008, in the Korean Intellectual Property Office, the entire content of which is incorporated herein by reference.

BACKGROUND

1. Field of the Invention

The present invention relates to a method for fabricating an organic light emitting display device.

2. Discussion of Related Art

Generally, organic light emitting display panels are formed and scribed on a single organic light emitting display mother board that is separated into the individual organic light emitting display panels. In other words, to more effectively produce a large amount of organic light emitting display devices, a-"sheet-unit" production method, which forms individual organic light emitting display panels on a single mother board and then scribes this mother board into the individual panels, has been adopted.

A test of the organic light emitting display panels that are individually separated is individually performed per panel with a test device on each panel unit. In this case, however, each panel has to be tested separately, which increases the overall testing time for all the panels.

Accordingly, the test of the organic light emitting display panels should be performed on a sheet unit or on the mother board before each panel is separated from the mother board.

However, in order to perform the test on the sheet unit, a plurality of sheet wires for supplying power and/or signals to the plurality of panels should be formed on the mother board.

These sheet wires are coupled to the plurality of panels to simultaneously (or parallelly) supply test signals from the test device to the plurality of panels. Accordingly, the test on the sheet unit or of the plurality of panels formed on the mother board can be performed, thereby improving the efficiency of the test.

The sheet wires are generally formed of the same material as components included in each panel, for example, drive elements (for example, thin film transistors) that are included in a pixel unit, a scan driver and/or a testing unit, etc.

However, during a fabricating process for forming the sheet wiring and the components of each panel on the mother board, electrostatic discharge (ESD) can be introduced externally. This electrostatic discharge may damage the panels during the fabrication to cause defect on the panels.

SUMMARY OF THE INVENTION

An aspect of an embodiment of the present invention is directed toward a method of fabricating an organic light emitting display device for preventing (or reducing) a defect of an organic light emitting display device by electrostatic discharge that may be generated during a fabricating process.

An embodiment of the present invention provides a method of fabricating an organic light emitting display device on a mother board formed with a plurality of panels and a plurality of sheet wires for supplying sheet test signals to the panels on the mother board. The method includes: defining each region of the panels on the mother board; forming a plurality of drive elements for driving the panels in each region of the panels and forming the sheet wires to be electrically coupled to at least a portion of the drive elements and forming a shorting bar to be electrically coupled to all of the sheet wires; forming a plurality of organic light emitting diodes in each of the panels; isolating the sheet wires from each other, the isolating of the sheet wires including etching a plurality of open regions of the shorting bar apart from a plurality of contact regions of the shorting bar for electrically coupling the shorting bar to the sheet wires; performing a sheet test on the plurality of panels, the performing of the sheet including supplying the sheet test signals to the sheet wires; and individually separating the panels, the separating of the sheet panels including scribing the mother board.

Herein, in one embodiment, materials constituting an anode layer of the organic light emitting diodes have lower reactivity than materials constituting the shorting bar, making it possible to etch the shorting bar using a Galvanic effect during a wet etch process for etching the anode layer.

With an embodiment of the present invention, all the panels should be equipotential by forming the shorting bar for shorting all the panels of the sheet wires during a LPTS process for forming the sheet wires and the drive elements of each panel. Therefore, the generation of electrostatic discharge is minimized (or reduced), making it possible to prevent damage of the panels during the LTPS process.

BRIEF DESCRIPTION OF THE DRAWINGS

The accompanying drawings, together with the specification, illustrate exemplary embodiments of the present invention, and, together with the description, serve to explain the principles of the present invention.

FIGS. 2A and 2B are plan schematic views for explaining a method of fabricating an organic light emitting display device according to an embodiment of the present invention;

DETAILED DESCRIPTION

Figure 1:
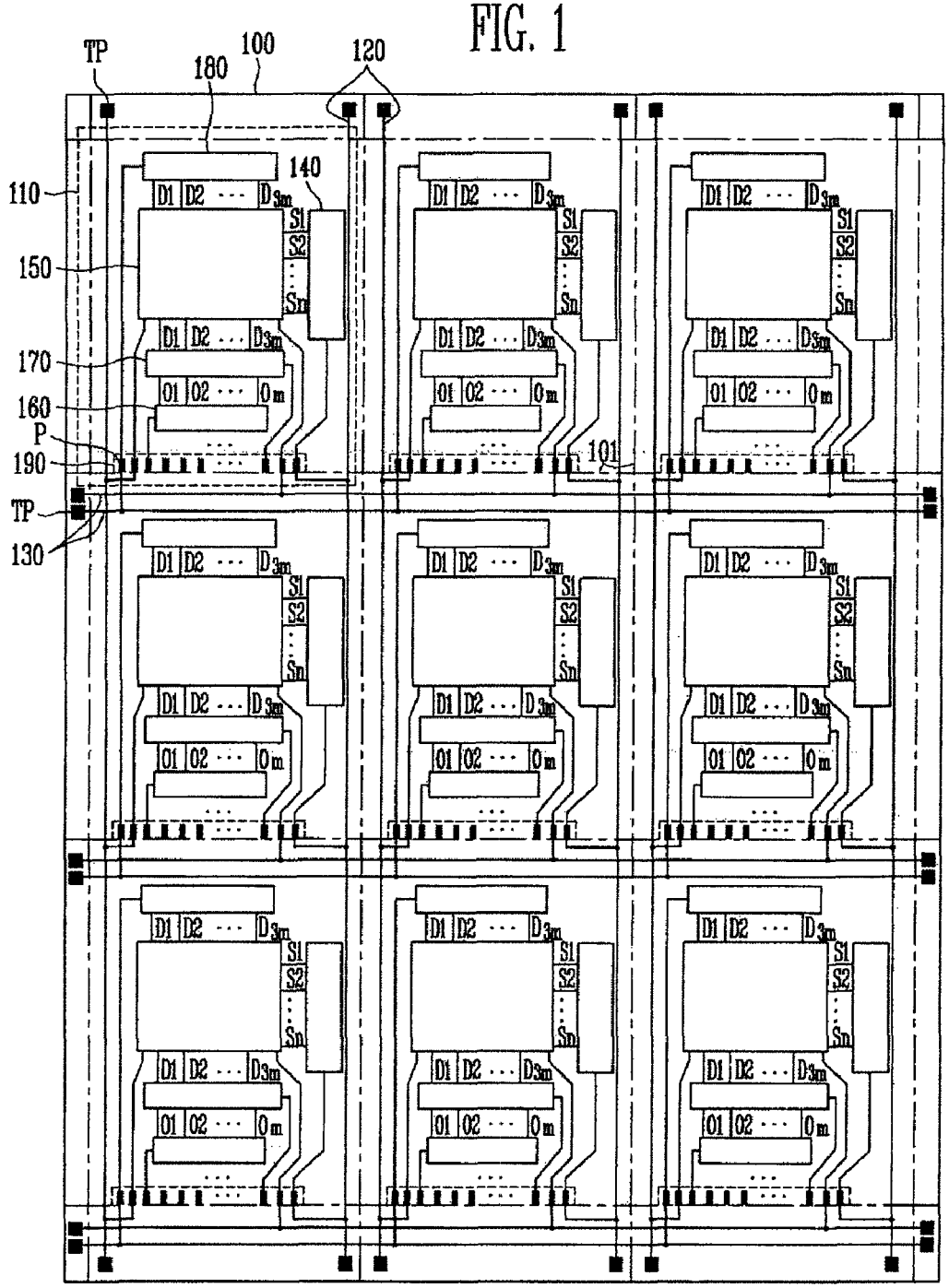
FIG. 1 is a plan schematic view showing an organic light emitting display mother board according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the element or indirectly on the element with one or more intervening elements interposed therebetween. Also, when an element is referred to as being "connected to" another element, it can be directly connected to the element or be indirectly connected to the element with one or more intervening elements interposed therebetween. Hereinafter, like reference numerals refer to like elements.

Hereinafter, embodiments of the present invention will be described in more detail with reference to the accompanying drawings.

FIG. 1 is a plan schematic view showing a mother board of an organic light emitting display device according to an embodiment of the present invention.

Referring to FIG. 1, an organic light emitting display mother board 100 according to an embodiment of the present invention includes: a plurality of organic light emitting display panels 110 arranged in a matrix pattern; and sheet wires 120 and 130 for supplying test signals to the plurality of panels 110.

Each panel 110 includes components, such as a scan driver 140, a pixel unit (or display region) 150, a first test unit (or a first tester) 160, a data distribution unit (or a data distributor) 170, a second test unit (or a second tester) 180, a pad unit (or a pad) 190, etc.

The scan driver 140 generates scan signals corresponding to scan drive power and scan control signals supplied from an external device and sequentially supply these signals to scan lines S1 to Sn.

The pixel unit 150 includes a plurality of pixels positioned at crossing (or intersection) regions of data lines D1 to D3$m$ and scan lines S1 to Sn. Each pixel includes organic light emitting diodes and drive elements (for example, thin film transistors, etc.)

The first test unit 160 is electrically connected to ends of the data lines D1 to D3$m$ through the data distribution unit 170. The first test unit 160 is provided to perform an array test for testing a coupling state of wirings or thin film transistors formed in the panel 110. The array test is performed in each panel 110 as a unit to detect the panel 110 having a defective coupling of the wire or the like in advance, i.e., when the drive elements are formed, but before the organic light emitting diode, etc. is formed.

In other words, the first test unit 160 is externally supplied with the array test signals from the array test device during the performance of the array test and outputs these test signals to output lines O1 to Om.

The data distribution unit 170 is coupled between the first test unit 160 and the pixel unit 150. The data distribution unit 170 supplies the array test signal supplied from the output lines O1 to Om of the first test unit to the data lines D1 to D3$m$ corresponding to clock signals (for example, red, green, and blue clock signals) supplied from an external device.

In addition, the data distribution unit 170 supplies data signals supplied from the output lines of the data driver to a data line D of each sub-pixel, after the test on the panels 110 is completed and each panel 110 is scribed from the mother board 100.

The second test unit 180 is electrically coupled to the other end of the data lines D1 to D3$m$. In other words, the first test unit 160 and the second test unit 180 are coupled to different ends (or opposite ends) of the data lines D1 to D3$m$, respectively, with the pixel unit 150 disposed between the first test unit 160 and the second test unit 180.

The second test unit 180 is provided to perform the sheet test that can individually test the plurality of panels 110 formed on the mother board 100. In other words, the second test unit 180 is supplied with the sheet test signals from the sheet wires 120 and/or 130 during the performance of the sheet test and outputs them to the data lines D1 to D3$m$. To this end, the second test unit 180 includes a plurality of switching elements that can be simultaneously (or concurrently) turned-on in performing the sheet test to supply the sheet test signals to the data lines D1 to D3$m$. The sheet test may include a leakage current test, a lighting test, an aging test, etc.

When performing the sheet test using the second test unit 180, the sheet test can be performed without using the data distribution unit 170. Therefore, the sheet test signals can simultaneously (or concurrently) be supplied to the data lines D1 to D3$m$. Accordingly, a problem in that difficulties in the synchronization of signals, which can be caused when delayed signals are input to the data distribution unit 170, is solved to prevent (or reduce) a malfunction of the panels 110, making it possible to more effectively perform the sheet test.

The pad unit 190 includes a plurality of pads P for transferring power and/or signals supplied from one or more external devices to an internal portion of the panel 110.

The sheet wires 120 and 130 are positioned at the outer regions of the panels 110 and arranged in a first direction (column or vertical direction) and/or a second direction (row or horizontal direction), such that they are commonly coupled to the panels 110 positioned in the same column and/or the same row.

The sheet wires 120 and 130 are supplied with the sheet test signals through a test pad (TP) on the mother board 100 and simultaneously (or concurrently) supply these test signals to the plurality of panels 110, making it possible to perform the sheet test.

Here, the sheet test signals supplied to the sheet wires 120 and 130 may include various suitable test control signals for controlling the test (upon performing the sheet test) and various suitable test signals for performing the lighting test, etc.

In other words, the sheet test on the plurality of panels 110 may be performed as a group after the completion of the formation process of the organic light emitting diodes. Then, the panels 110 subjected to the sheet test are scribed along a scribing line 10 so that they are separated into the individual panels 110.

However, the sheet wires 120 and 130 are still electrically coupled to elements driven upon performing the sheet test of the components included in each panel 110, for example, to the drive elements of the scan driver 140, the pixel unit 150, and/or the second test unit 180. Herein, a representative example of the driving devices includes the thin film transistor (hereinafter, referred to as a TFT), etc. Hereinafter, for convenience of explanation, it will be described under the assumption that the driving element is the TFT.

In other words, in the process of forming the TFT and the associated wirings on the mother board, the sheet wires 120 and 130, which are electrically connected to the TFT, are simultaneously (or concurrently) formed of the same material as the TFT and/or the associated wirings. For example, in the process of forming the source/drain electrodes of the TFT, the sheet wires 120 and 130 may be simultaneously (or concurrently) formed with the source/drain electrodes of TFT using the metals for forming source/drain electrodes.

However, in order to prevent (or protect from) a short between the sheet wires 120 and 130 arranged in different directions and supplied with different and/or the same signals, the sheet wires 120 and 130 may be formed of different materials on different layers along their arrangement direction. In one embodiment, the sheet wires 120 and 130 are formed of the same material on the same layer regardless of the arrangement direction, but are formed not to be short at the intersected (or crossing) portions by utilizing one or more coupling structures through the other layer.

Here, the TFT may be formed of low temperature polycrystalline silicon (LTPS). For convenience, the process of forming TFTs, internal wirings of the panel 110, and the sheet wires 120 and 130 on the mother board is now referred to as an LTPS process.

In addition, during the LTPS process, electrostatic discharge may be introduced externally. The electrostatic discharge can damage the panels 110 (for example, the TFTs) during their fabrication, and thus the electrostatic discharge should be minimized (or reduced) to prevent the occurrence of the defect of the panels 110.

A fabrication method for minimizing (or reducing) the occurrence of the electrostatic discharge during the LTPS process in an embodiment of the present invention is described in more detail below. The detailed description thereof will be described below with reference to FIGS. 2A to 4.

Figure 2B:
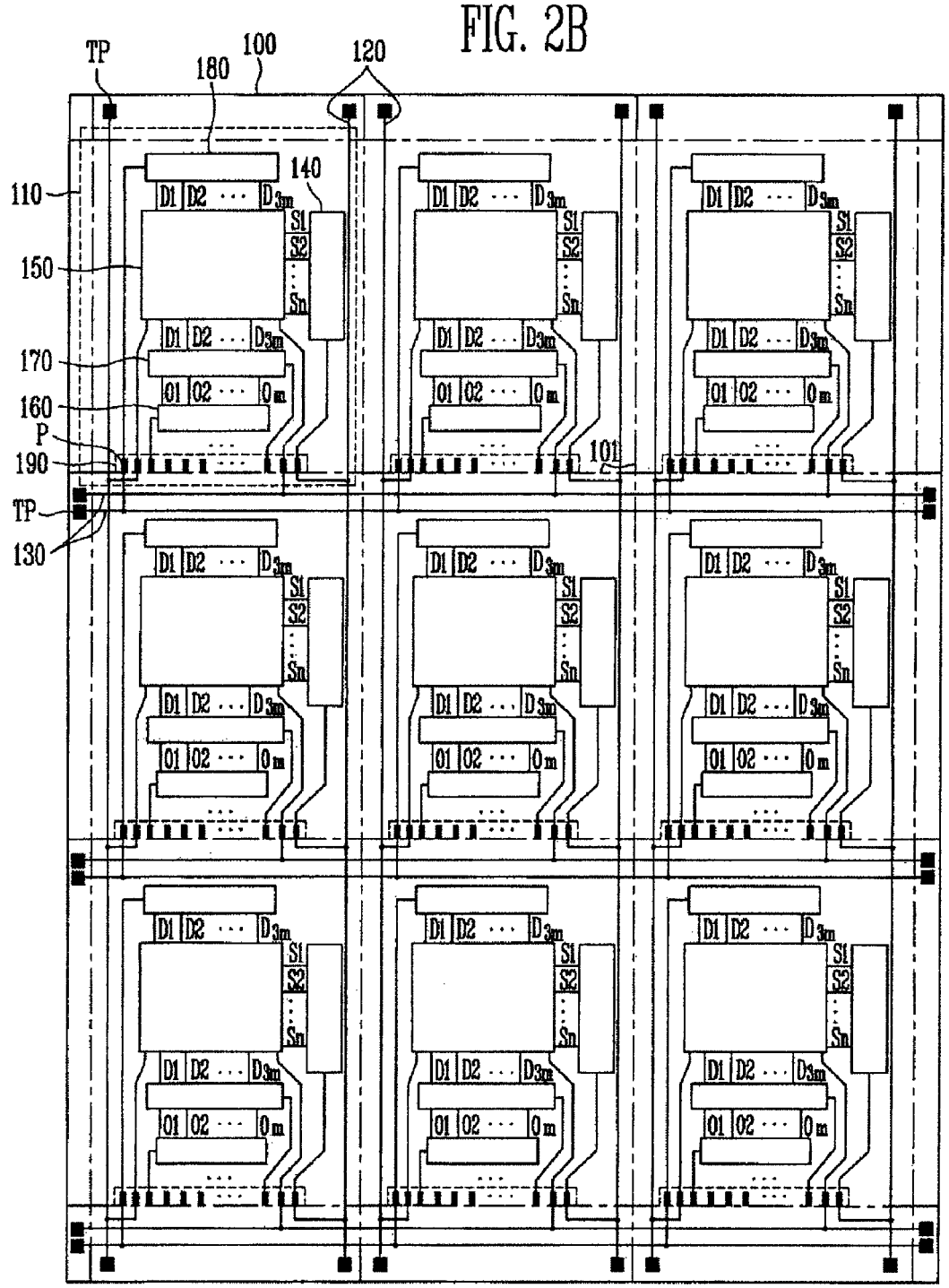

FIGS. 2A and 2B are plan schematic views explaining a fabricating method of an organic light emitting display device according to an embodiment of the present invention.

Referring to FIGS. 2A to 2B, first, after defining each region of the panels 110 on the mother board 100, the LTPS process is performed. Herein, the LTPS process refers to a process of forming the drive elements (for example, the TFTs) of the drive components, such as the scan driver 140, the pixel unit 150, the first test unit 160, the data distribution unit 170, and/or the second test unit 180, internal wires, and sheet wires 120 and 130.

However, in an embodiment of the present invention, as shown in FIG. 2A, a shorting bar 200 electrically connecting all the sheet wires 120 and 130 are formed during the performance of the LTPS process.

For example, the shorting bar 200 may be formed by patterning the gate metal during the forming of the gate electrode of TFT. The shorting bar 200 is coupled to the test pads TP of the sheet wires 120 and 130 by contact hole(s) in the subsequent process of forming the source/drain electrode of the TFT to electrically connect all the sheet wires 120 and 130. In this case, the shorting bar 200 may be formed at an edge (or edge portion) of the mother board 100.

Accordingly, during the LTPS process, the panels 110 are equipotentialed by the shorting bar 200 to minimize (or reduce) the electrostatic discharge. Thereby, the panels 110 during the fabrication can be protected from the electrostatic discharge.

The shorting bar 200 is etched out (or completely etched) during the forming of the organic light emitting diode in the pixel unit (or display region) 150 and the subsequent processes (for example, a process of forming a spacer, etc.).

In other words, after the subsequent process, such as the process of forming the organic light emitting diode, which is subsequent to the LTPS process, is completed, the shorting bar 200 is etched out to isolate the sheet wires 120 and 130 from each other as shown in FIG. 2B.

Accordingly, the sheet test can be performed using the sheet wires 120 and 130, making it possible to perform the sheet test on the plurality of panels 1110 by supplying the sheet test signals to the sheet wires 120 and 130.

When the sheet test is completed, the mother board is scribed based on the scribing line 201 to separate it into the individual panels 110, thereby simultaneously (or concurrently) fabricating the plurality of panels 110.

As described above, all the panels 110 can be equipotentialed by the formation of the shorting bar 200 for shorting all the test pads TP of the sheet wires 120 and 130 during the LTPS process for forming the sheet wires 120 and 130 and the drive elements (TFTs) of each panel. Therefore, the occurrence of the electrostatic discharge is minimized during the LTPS process, making it possible to prevent (or reduce) the damage of the panels 110.

Also, the shorting bar is completely etched in the subsequent processes, for example, the process of forming the organic light emitting diode, making it possible to smoothly conduct the sheet test using the sheet wires 120 and 130.

An embodiment of the present invention provides a scheme for automatically opening (or open circuiting) the shorting bar 200 using a Galvanic effect without having a separate process step for etching the shorting bar 200. This will be described in more detail with reference to FIGS. 3A to 3E.

FIGS. 3A to 3E are cross-sectional schematic views of main parts for explaining a fabricating method of an organic light emitting display device according to an embodiment of the present invention. For convenience, FIGS. 3A to 3E show the test pads of two sheet wires and only the shorting bar region therebetween.

Referring to FIGS. 3A to 3E, a buffer layer 101, a semiconductor layer (formed in the TFT region), and a gate insulating film 102 are formed on the mother board 100.

Then, the gate metal is formed and patterned on the gate insulating film 102 to form the shorting bar 200 and the gate electrode (formed in the TFT region). Here, the gate metal may include molybdenum Mo or molybdenum-tungsten MoW, etc. In addition, the shorting bar 200 is formed in a pattern for connecting all the regions in which the test pads of the aforementioned sheet wires will be formed.

Thereafter, an inter-insulator 103 of SiNx and/or SiOx, etc. is formed and patterned on the mother board 100 including the shorting bar 200 and the gate electrode.

However, in the patterning process of the inter-insulator 103, the shorting bar 200 is exposed at the contact regions (CA) and the open regions (OA) by forming contact holes and via holes in regions (hereinafter, referred to as contact regions (CA)) to be electrically coupled to the sheet wires and regions (hereinafter, open regions (OA)) of the shorting bar 200 apart from the contact regions (CA) of the shorting bar 200.

Figure 3A:
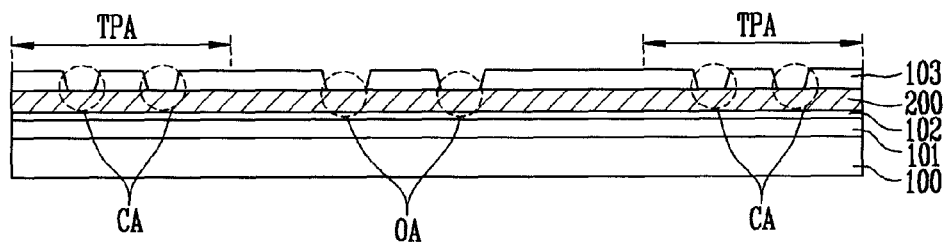
FIGS. 3A to 3E are cross-sectional schematic views of main parts for explaining a method of fabricating an organic light emitting display device according to an embodiment of the present invention.

Herein, one or more contact regions (CA) are positioned in a region (TPA) in which the test pads of the sheet wires will be formed and one or more open regions (OA) are positioned between the regions (TPA) in which the test pads of the sheet wires will be formed. Here, the contact hole and the via hole may be formed by a dry etch, etc. and in this process, the shorting bar is slightly etched (FIG. 3A).

Thereafter, the source/drain metals on the inter-insulator 103 are formed and patterned to form the sheet wires 120 or 130 and the source/drain electrodes (formed in the TFT region). Here, the sheet wires 120 or 130 are electrically coupled to the shorting bar 200 by the contact holes in the contact regions (CA) of the test pad region (TPA). Also, the source/drain metals are formed of Ti/Al/Ti, etc., so that they may be patterned by the dry etch, etc. In this case, the open regions (OA) of the shorting bar 200 are exposed to be finely etched but maintain the electrical coupling state.

Thereafter, a planarization layer 121 is formed and patterned on the sheet wires 120 or 130 and the source/drain electrode. However, the planarization layer 121 is patterned to expose the open region (OA) of the shorting bar 200 (to form the via holes in the open regions (OA)) even in this process.

Herein, although the planarization layer 121 is shown with a single layer, it may actually be constituted by multi-layers. For example, the planarization layer 121 may be constituted by a first planarization layer of SiNx and a second planarization layer of acryl. In this case, each of the first planarization layer and the second planarization is formed with the via holes to expose a portion of the sheet wires 120 or 130 in the test pad region TPA.

Figure 3B:
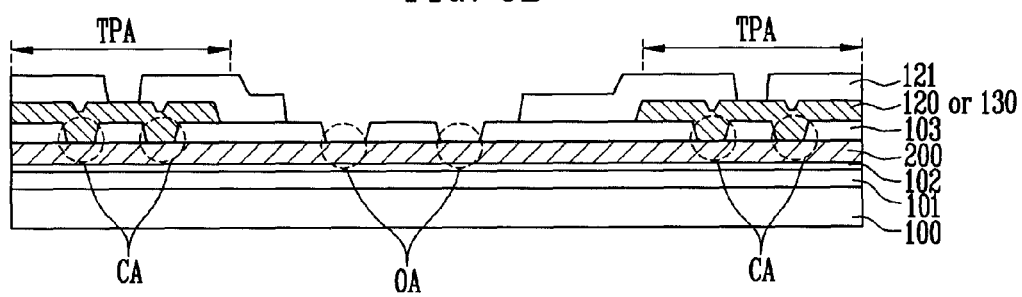
Figure 3C:
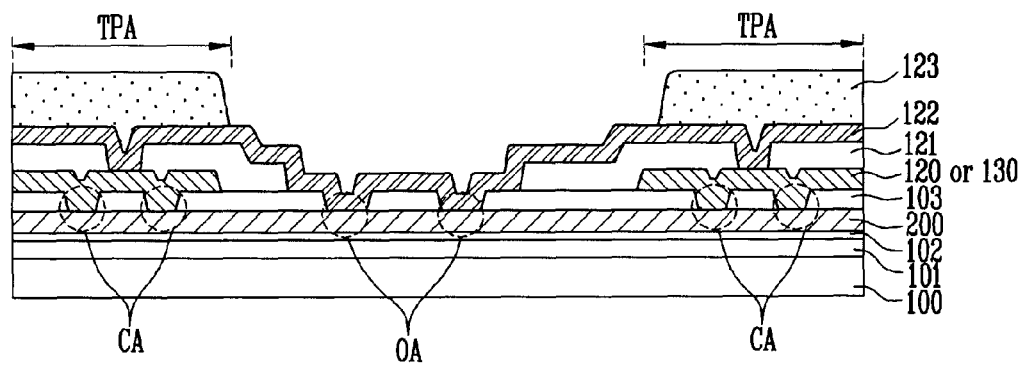

In addition, the open regions (OA) of the shorting bar may be finely etched in the process of forming the via hole of the planarization layer 121. For example, the open regions (OA) may be finely etched during a process of forming the via holes in the first planarization layer of SiNx. However, since the fine etching cannot completely etch the open regions (OA), the shorting bar 200 still maintains the electrical coupling state (FIG. 3B).

Then, an anode layer 122 is formed on the mother board 100 including the planarization layer 121 and the open regions (OA). Herein, the anode layer 122 may be formed of materials with lower reactivity than the shorting bar 200, for example, ITO or ITO/Ag/ITO. The anode layer 122 may be electrically coupled to the sheet wires 120 or 130 through the via holes of the planarization layer 121 in the test pad region TPA.

Thereafter, a photo resist layer 123 is formed on one region of the anode layer 122. Here, the photo resist layer 123 is positioned on the test pad region (TPA) and on an upper portion of a region in which the organic light emitting diode will be formed and is patterned to expose the anode layer 122 at the open regions (OA) (FIG. 3).

Next, the anode layer 122 is patterned using the photo resist film 123 as a mask. Here, the anode layer 122 is patterned by wet etching using an etchant.

However, since the anode layer 122 is formed of materials with lower reactivity than the shorting bar 200, the open regions (OA) of the shorting bar 200 are naturally etched by the Galvanic effect due to the difference in the reactivity of the shorting bar 200 and the anode layer 122 in the etchant.

Figure 3D:
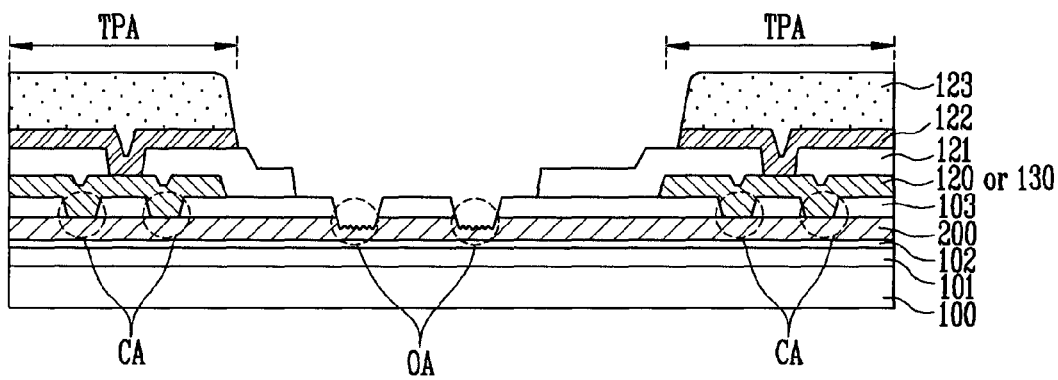

In other words, in the patterning process of the anode layer through wet etching, the open regions (OA) of the shorting bar 200 are etched by the Galvanic effect to begin to automatically open (or open circuit) the shorting bar 200 (FIG. 3D).

Then, the photo resist layer 123 is removed through a strip by a resist stripper (PR stripper). The open regions (OA) of the shorting bar 200 are further etched by the generation of Galvanic effect due to the difference in the reactivity of the anode layer 122 and the shorting bar 200 in the PR stripper during the strip process. Thereby, the shorting bar is opened (or open circuited) to isolate the sheet wires 120 or 130 from each other.

Figure 3E:
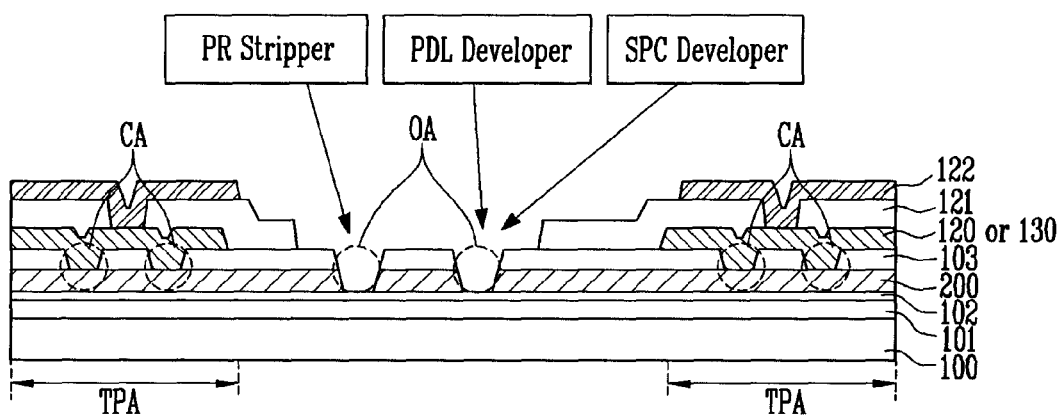

Also, the shorting bar 200 is completely opened by the Galvanic effect generated in a pixel define layer developer (PDL developer) and a spacer developer (SPC developer) during the process of forming the pixel define layer and the spacer. As such, the stability of the sheet wires 120 or 130 is ensured (FIG. 3E).

As described above, with an embodiment of the present invention, the shorting bar 200 formed to minimize (or reduce) the electrostatic discharge during the LTPS process can automatically be opened (or open circuited) by the Galvanic effect in the subsequent process of the LTPS process. Accordingly, the sheet test can be smoothly conducted without an additional process.

Figure 4:
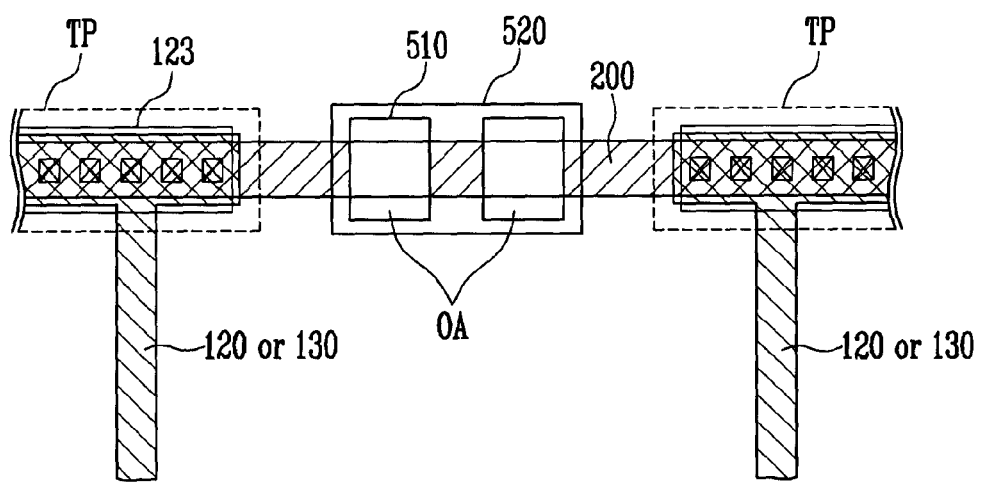
FIG. 4 is an enlarged schematic view showing parts of a region of a shorting bar opened (or open circuited) according to an embodiment of the present invention.

FIG. 4 is an enlarged schematic view showing parts of a region of a shorting bar opened (or open circuited) according to an embodiment of the present invention.

Referring to FIG. 4, a region of the shorting bar 200 is opened (or open circuited) between the test pads (TP) of the sheet wires 120 or 130, making it possible to electrically separate (or insulate) the sheet wires 120 or 130 from each other.

Herein, reference numerals 510 and 520 represent the via holes formed on each stack layer when the planarization layer is formed of two stack layers. The open regions (OA) are formed in the region formed with the via holes.

Although FIG. 4 shows the formation of two open regions (OA) in the shorting bar 200 formed between the test pads (TP) of two sheet wires 120 or 130 for convenience of explanation, the number of the open regions (OA) may suitably vary according to a distance between the test pads TP.

Also, embodiments of the present invention describe examples of forming the shorting bar 200 that are electrically coupled to the sheet wires 120 or 130, but the present invention is not thereby limited. For example, when forming other wires (for example, scan lines and/or data lines, etc) inside the panels, the shorting bar 200 can be formed by applying the technical idea of the present invention and can be automatically opened (or open circuited) using the Galvanic effect.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of fabricating an organic light emitting display device on a mother board formed with a plurality of panels and a plurality of sheet wires for supplying sheet test signals to the panels on the mother board, the method comprising:
   forming a plurality of drive elements for driving the panels in each of the panels and forming the sheet wires to be electrically coupled to at least a portion of the drive elements and forming a shorting bar to be electrically coupled to all of the sheet wires;
   forming a plurality of organic light emitting diodes in each of the panels and isolating the sheet wires from each other, the forming of the organic light emitting diodes and the isolating of the sheet wires comprising etching a plurality of open regions of the shorting bar apart from a plurality of contact regions of the shorting bar for electrically coupling the shorting bar to the sheet wires;
   performing a sheet test on the plurality of panels, the performing of the sheet comprising supplying the sheet test signals to the sheet wires; and
   individually separating the panels, the separating of the panels comprising scribing the mother board.

2. The method as claimed in claim 1, wherein the forming of the drive elements and the forming of the sheet wires and the forming of the shorting bar comprise:
   forming and patterning a gate metal on the mother board to form the shorting bar;
   exposing the open regions and the contact regions, the exposing of the open regions and the contact regions comprising forming an inter-insulator on the mother board with the shorting bar and patterning the inter-insulator at the open regions and the contact regions; and
   forming and patterning source/drain metals on the inter-insulator and connecting the shorting bar and the sheet wires through the contact regions.

3. The method as claimed in claim 1, wherein the forming of the organic light emitting diodes and the isolating of the sheet wires comprise:
   forming a planarization layer on the sheet wires and exposing the open regions;
   forming an anode layer on the mother board with the planarization layer and the open regions;
   forming a photo resist layer on a region of the anode layer and exposing the anode layer at the open regions; and
   patterning the anode layer as well as etching the open regions by a wet etch process utilizing an etchant.

4. The method as claimed in claim 3, wherein materials constituting the anode layer have lower reactivity than materials constituting the shorting bar, and wherein the shorting bar are etched by utilizing a Galvanic effect during the wet etch process.

5. The method as claimed in claim 4, wherein the anode layer is formed of indium tin oxide (ITO) or ITO/Ag/ITO, and the shorting bar is formed of Mo or MoW.

6. The method as claimed in claim 3, wherein the forming of the organic light emitting diodes and the isolating of the sheet wires further comprise electrically coupling the anode layer to the sheet wires, and the electrically coupling of the anode layer to the sheet wires comprising forming a via hole on the planarization layer at the contact regions.

7. The method as claimed in claim 3, wherein the forming of the organic light emitting diodes and the isolating of the sheet wires further comprise stripping the photo resist layer by a resist stripper, and further etching the open regions, the further etching of the open regions comprising using a Galvanic effect due to a difference in reactivity of the anode layer and the shorting bar in the resist stripper.

8. The method as claimed in claim 1, wherein the contact regions are positioned at the test pads of the sheet wires, and the shorting bar are formed at edge portions of the mother board to be electrically coupled to the test pads of the sheet wires in the forming of the drive elements.

9. The method as claimed in claim 8, wherein the open regions are positioned between the test pads of the sheet wires.

10. A method of fabricating an organic light emitting display device on a mother board formed with a plurality of panels and a plurality of sheet wires for supplying sheet test signals to the panels on the mother board, the method comprising:
    forming a plurality of drive elements for driving the panels in each of the panels;
    forming the sheet wires to be electrically coupled to at least a portion of the drive elements;
    forming a shorting bar to be electrically coupled to all of the sheet wires;
    forming a plurality of organic light emitting diodes in each of the panels and isolating the sheet wires from each other, the forming of the organic light emitting diodes and the isolating of the sheet wires comprising etching a plurality of open regions of the shorting bar apart from a plurality of contact regions of the shorting bar for electrically coupling the shorting bar to the sheet wires;
    performing a sheet test on the plurality of panels, the performing of the sheet comprising supplying the sheet test signals to the sheet wires; and
    individually separating the panels, the separating of the panels comprising scribing the mother board.

11. The method as claimed in claim 10, further comprising:
    forming and patterning a gate metal on the mother board to form the shorting bar;
    exposing the open regions and the contact regions, the exposing of the open regions and the contact regions comprising forming an inter-insulator on the mother board with the shorting bar and patterning the inter-insulator at the open regions and the contact regions; and
    forming and patterning source/drain metals on the inter-insulator and connecting the shorting bar and the sheet wires through the contact regions.

12. The method as claimed in claim 10, further comprising:
    forming a planarization layer on the sheet wires and exposing the open regions;
    forming an anode layer on the mother board with the planarization layer and the open regions;
    forming a photo resist layer on a region of the anode layer and exposing the anode layer at the open regions; and
    patterning the anode layer as well as etching the open regions by a wet etch process utilizing an etchant.

13. The method as claimed in claim 12, wherein materials constituting the anode layer have lower reactivity than materials constituting the shorting bar, and wherein the shorting bar are etched by utilizing a Galvanic effect during the wet etch process.

14. The method as claimed in claim 13, wherein the anode layer is formed of indium tin oxide (ITO) or ITO/Ag/ITO, and the shorting bar is formed of Mo or MoW.

15. The method as claimed in claim 12, further comprising electrically coupling the anode layer to the sheet wires, the electrically coupling of the anode layer to the sheet wires comprising forming a via hole on the planarization layer at the contact regions.

16. The method as claimed in claim 12, further comprising stripping the photo resist layer by a resist stripper, and further etching the open regions, the further etching of the open regions comprising using a Galvanic effect due to a difference in reactivity of the anode layer and the shorting bar in the resist stripper.

17. The method as claimed in claim 10, wherein the contact regions are positioned at the test pads of the sheet wires, and the shorting bar are formed at edge portions of the mother board to be electrically coupled to the test pads of the sheet wires in the forming of the drive elements.

18. The method as claimed in claim 17, wherein the open regions are positioned between the test pads of the sheet wires.

19. A method of fabricating an organic light emitting display device on a mother board formed with a plurality of panels and a plurality of sheet wires for supplying sheet test signals to the panels on the mother board, the method comprising:
    forming a plurality of drive elements for driving the panels in each of the panels;
    forming the sheet wires to be electrically coupled to at least a portion of the drive elements;
    forming a shorting bar to be electrically coupled to at least a portion of the sheet wires;
    forming a plurality of organic light emitting diodes in each of the panels and isolating the sheet wires from each other, the forming of the organic light emitting diodes and the isolating of the sheet wires comprising etching an open region of the shorting bar apart from a contact region of the shorting bar for electrically coupling the shorting bar to the sheet wires;
    performing a sheet test on the plurality of panels, the performing of the sheet comprising supplying the sheet test signals to the sheet wires; and
    individually separating the panels, the separating of the panels comprising scribing the mother board.

* * * * *